(12) United States Patent
Miller et al.

(10) Patent No.: US 6,268,224 B1
(45) Date of Patent: Jul. 31, 2001

(54) METHOD AND APPARATUS FOR DETECTING AN ION-IMPLANTED POLISHING ENDPOINT LAYER WITHIN A SEMICONDUCTOR WAFER

(75) Inventors: Gayle W. Miller, Colorado Springs, CO (US); Michael F. Chisholm, Garland, TX (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/108,091

(22) Filed: Jun. 30, 1998

(51) Int. Cl.$^7$ ................................. H01L 21/00

(52) U.S. Cl. ........................ 438/10; 438/17; 438/692

(58) Field of Search ................... 456/345; 451/6, 451/5, 41, 287; 216/88, 89, 86; 438/692, 693, 10, 17

(56) References Cited

U.S. PATENT DOCUMENTS

| | | |
|---|---|---|
| 3,734,620 | 5/1973 | Cade ........................ 356/73 |
| 3,748,014 | 7/1973 | Beiser ........................ 350/6 |
| 4,312,732 | 1/1982 | Degenkolb et al. ........... 204/192 |
| 4,374,915 | 2/1983 | Ahlquist et al. . |
| 4,632,724 | 12/1986 | Chesebro et al. . |
| 4,689,491 | 8/1987 | Lindow et al. .............. 250/572 |
| 4,793,895 | 12/1988 | Kaanta et al. .............. 156/627 |
| 5,036,015 | * 7/1991 | Sandhu et al. .............. 438/692 |
| 5,081,421 | 1/1992 | Miller et al. ............... 324/671 |
| 5,151,584 | 9/1992 | Ebbing et al. .............. 250/201.4 |
| 5,169,491 | 12/1992 | Doan ........................ 156/636 |
| 5,196,353 | 3/1993 | Sandhu et al. .............. 437/8 |
| 5,222,329 | 6/1993 | Yu ........................... 51/165.77 |
| 5,240,552 | 8/1993 | Yu et al. ................... 156/636 |
| 5,245,790 | 9/1993 | Jerbic . |
| 5,245,794 | 9/1993 | Salugsugan ................. 51/165.74 |
| 5,258,093 | 11/1993 | Maniar . |
| 5,265,378 | 11/1993 | Rostoker ..................... 51/165.75 |
| 5,272,115 | 12/1993 | Sato ........................ 437/228 |
| 5,308,438 | 5/1994 | Cote et al. ................. 156/636 |
| 5,310,455 | 5/1994 | Pasch et al. . |
| 5,321,304 | 6/1994 | Rostoker . |
| 5,337,015 | * 8/1994 | Lustig et al. .............. 438/692 |
| 5,362,669 | 11/1994 | Boyd et al. . |
| 5,385,866 | 1/1995 | Bartush . |
| 5,389,194 | 2/1995 | Rostoker et al. . |
| 5,399,234 | 3/1995 | Yu et al. ................... 156/636 |
| 5,403,228 | 4/1995 | Pasch . |
| 5,405,806 | 4/1995 | Pfiester et al. ............. 437/200 |
| 5,439,551 | 8/1995 | Meikle et al. . |
| 5,449,314 | 9/1995 | Meikle et al. . |
| 5,483,568 | 1/1996 | Yano et al. ................. 378/44 |
| 5,492,594 | 2/1996 | Burke et al. ................ 216/86 |
| 5,516,400 | 5/1996 | Pasch et al. . |
| 5,531,861 | 7/1996 | Yu et al. ................... 156/636.1 |
| 5,559,428 | 9/1996 | Li et al. ................... 324/71.5 |
| 5,561,541 | 10/1996 | Sharp et al. ............... 359/66 |
| 5,595,526 | 1/1997 | Yau et al. .................. 451/8 |
| 5,597,442 | 1/1997 | Chen et al. ................. 156/626.1 |
| 5,597,590 | 1/1997 | Tanimoto et al. . |
| 5,607,341 | 3/1997 | Leach ....................... 451/41 |

(List continued on next page.)

Primary Examiner—Thi Dang

(57) ABSTRACT

A method of fabricating a semiconductor wafer having a polishing endpoint layer which is formed by implanting ions into the wafer includes the step of polishing the wafer in order to remove material from the wafer. The method also includes the step of detecting a first change in friction when material of the ion-implanted polishing endpoint layer begins to be removed during the polishing step. The method further includes the step of detecting a second change in friction when material of the ion-implanted polishing endpoint layer ceases to be removed during the polishing step. Moreover, the method includes the step of terminating the polishing step in response to detection of the second change in friction. An apparatus for polishing a semiconductor wafer down to an ion-implanted polishing endpoint layer in the wafer is also disclosed.

15 Claims, 4 Drawing Sheets

OTHER PUBLICATIONS

| | | | |
|---|---|---|---|
| 5,609,511 | 3/1997 | Moriyama et al. | 451/5 |
| 5,614,446 | 3/1997 | Ramaswami et al. . | |
| 5,624,304 | 4/1997 | Pasch et al. . | |
| 5,626,715 | 5/1997 | Rostoker . | |
| 5,627,110 | 5/1997 | Lee et al. . | |
| 5,637,185 | 6/1997 | Murarka et al. | 438/5 |
| 5,639,388 | 6/1997 | Kimura et al. | 216/84 |
| 5,643,046 | 7/1997 | Katakabe et al. . | |
| 5,643,050 | 7/1997 | Chen | 451/10 |
| 5,643,061 | 7/1997 | Jackson et al. | 451/289 |
| 5,644,221 | 7/1997 | Li et al. | 324/71.5 |
| 5,645,682 | 7/1997 | Skrovan . | |
| 5,647,952 | 7/1997 | Chen | 156/636.1 |
| 5,656,229 | 8/1997 | Tanimoto et al. . | |
| 5,658,183 | 8/1997 | Sandhu et al. | 451/5 |
| 5,660,672 | 8/1997 | Li et al. | 156/345 |
| 5,663,101 | 9/1997 | Cronin . | |
| 5,663,797 | 9/1997 | Sandhu | 438/16 |
| 5,664,987 | 9/1997 | Rentein | 451/21 |
| 5,667,424 | 9/1997 | Pan | 451/6 |
| 5,667,433 | 9/1997 | Mallon . | |
| 5,667,629 * | 9/1997 | Pan et al. | 438/692 |
| 5,668,063 | 9/1997 | Fry et al. | 438/5 |
| 5,670,410 | 9/1997 | Pan | 437/60 |
| 5,672,091 | 9/1997 | Takahashi et al. | 451/6 |
| 5,674,784 * | 10/1997 | Jang et al. | 438/691 |
| 5,681,215 | 10/1997 | Sherwood | 568/215 |
| 5,691,253 | 11/1997 | Kobayashi . | |
| 5,695,660 | 12/1997 | Litvak | 216/85 |
| 5,700,180 | 12/1997 | Sandhu et al. | 451/5 |
| 5,702,292 | 12/1997 | Brunelli et al. . | |
| 5,704,987 | 1/1998 | Huynh et al. . | |
| 5,705,320 | 1/1998 | Hsu et al. . | |
| 5,705,435 | 1/1998 | Chen | 438/8 |
| 5,710,076 | 1/1998 | Dai et al. | 438/305 |
| 5,712,185 | 1/1998 | Tsai et al. | 437/67 |
| 5,716,873 | 2/1998 | Prall et al. . | |
| 5,720,845 | 2/1998 | Liu . | |
| 5,722,875 | 3/1998 | Iwashita et al. | 451/8 |
| 5,722,877 | 3/1998 | Meyer et al. . | |
| 5,725,417 | 3/1998 | Robinson . | |
| 5,736,462 | 4/1998 | Takahashi et al. . | |
| 5,738,567 | 4/1998 | Manzonie et al. . | |
| 5,741,171 | 4/1998 | Sarfaty et al. | 451/6 |
| 5,747,380 | 5/1998 | Yu et al. . | |
| 5,755,614 | 5/1998 | Adams et al. . | |
| 5,762,536 | 6/1998 | Pant et al. . | |
| 5,762,537 | 6/1998 | Sandhu et al. . | |
| 5,777,739 | 7/1998 | Sandhu et al. | 356/357 |
| 5,795,495 | 8/1998 | Meikle . | |
| 5,861,055 | 1/1999 | Allman et al. . | |
| 5,865,666 | 2/1999 | Nagahara . | |
| 5,868,608 | 2/1999 | Allman et al. . | |
| 5,877,088 * | 3/1999 | Samitsu et al. | 438/692 |
| 5,882,244 | 3/1999 | Hiyama et al. . | |
| 5,882,251 | 3/1999 | Berman et al. . | |
| 5,888,120 | 3/1999 | Doran . | |
| 5,893,756 | 4/1999 | Berman et al. . | |
| 5,931,719 | 8/1999 | Nagahara et al. . | |
| 5,948,697 | 9/1999 | Hata . | |
| 5,957,757 | 9/1999 | Berman . | |

* cited by examiner

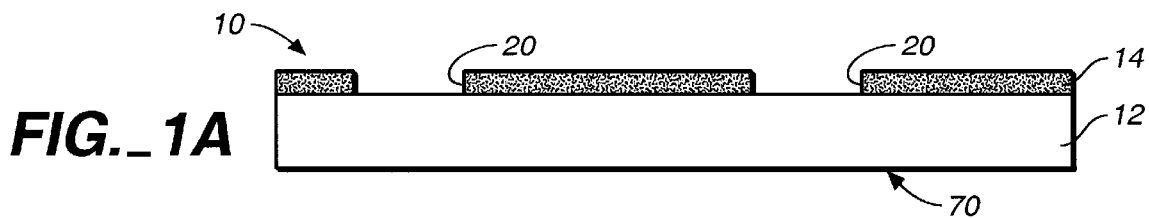
FIG._1A
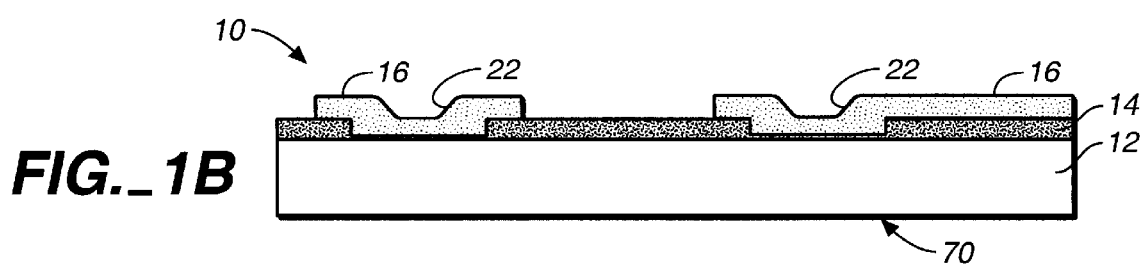
FIG._1B
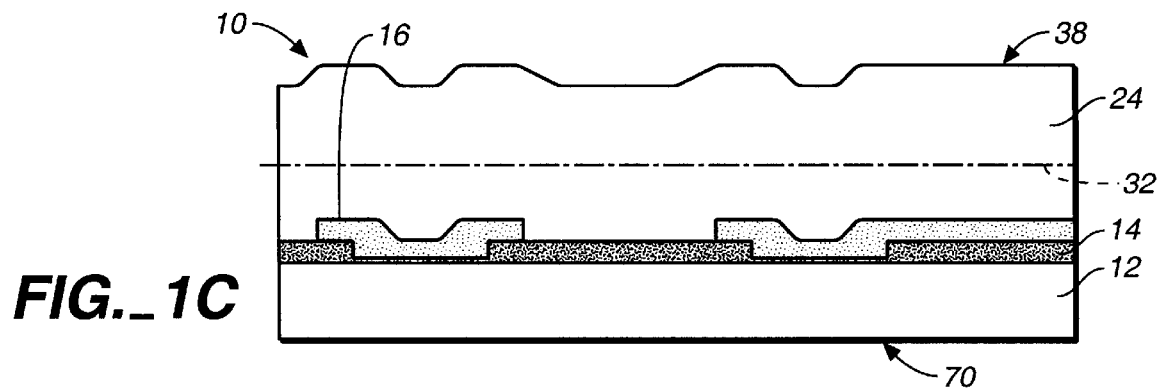
FIG._1C
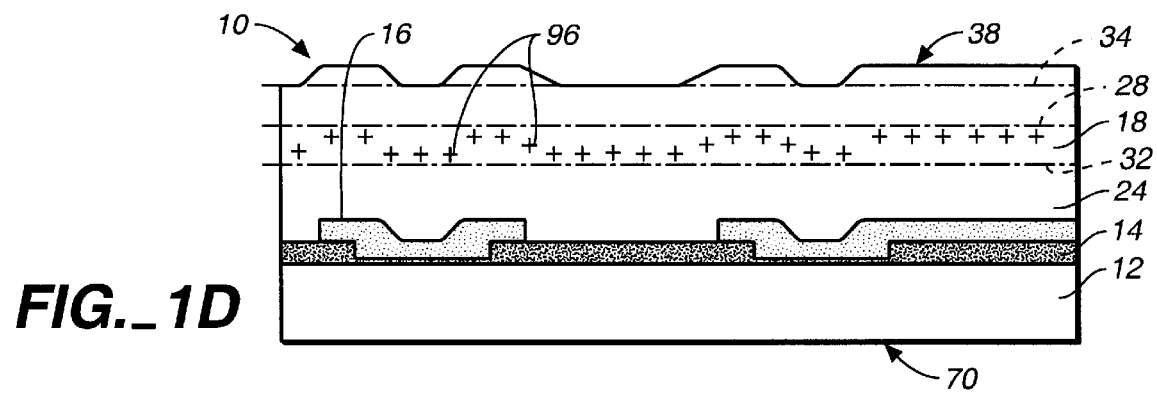
FIG._1D

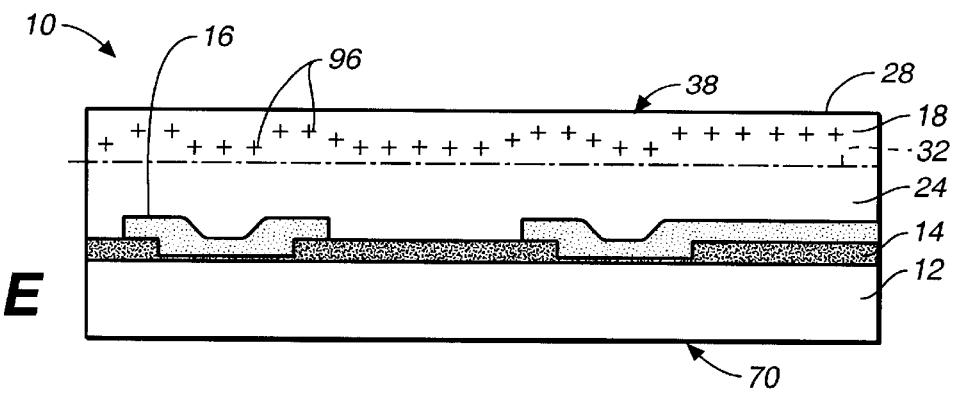
FIG._1E
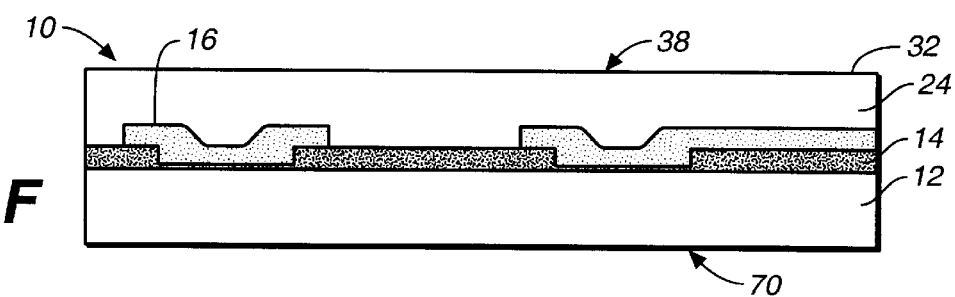
FIG._1F
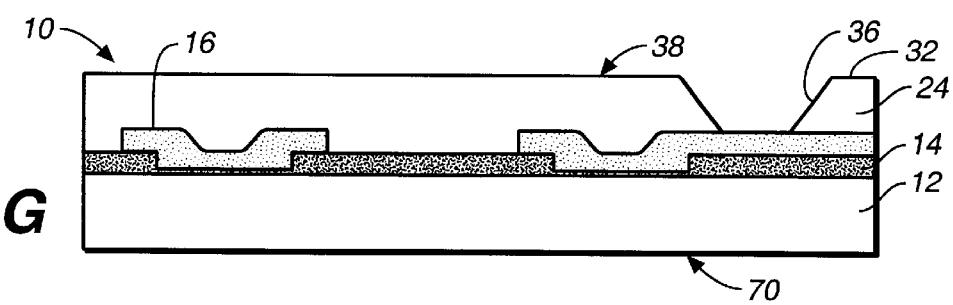
FIG._1G
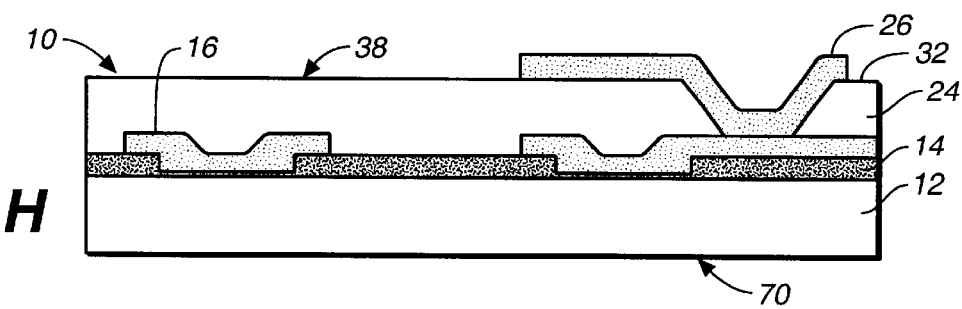
FIG._1H

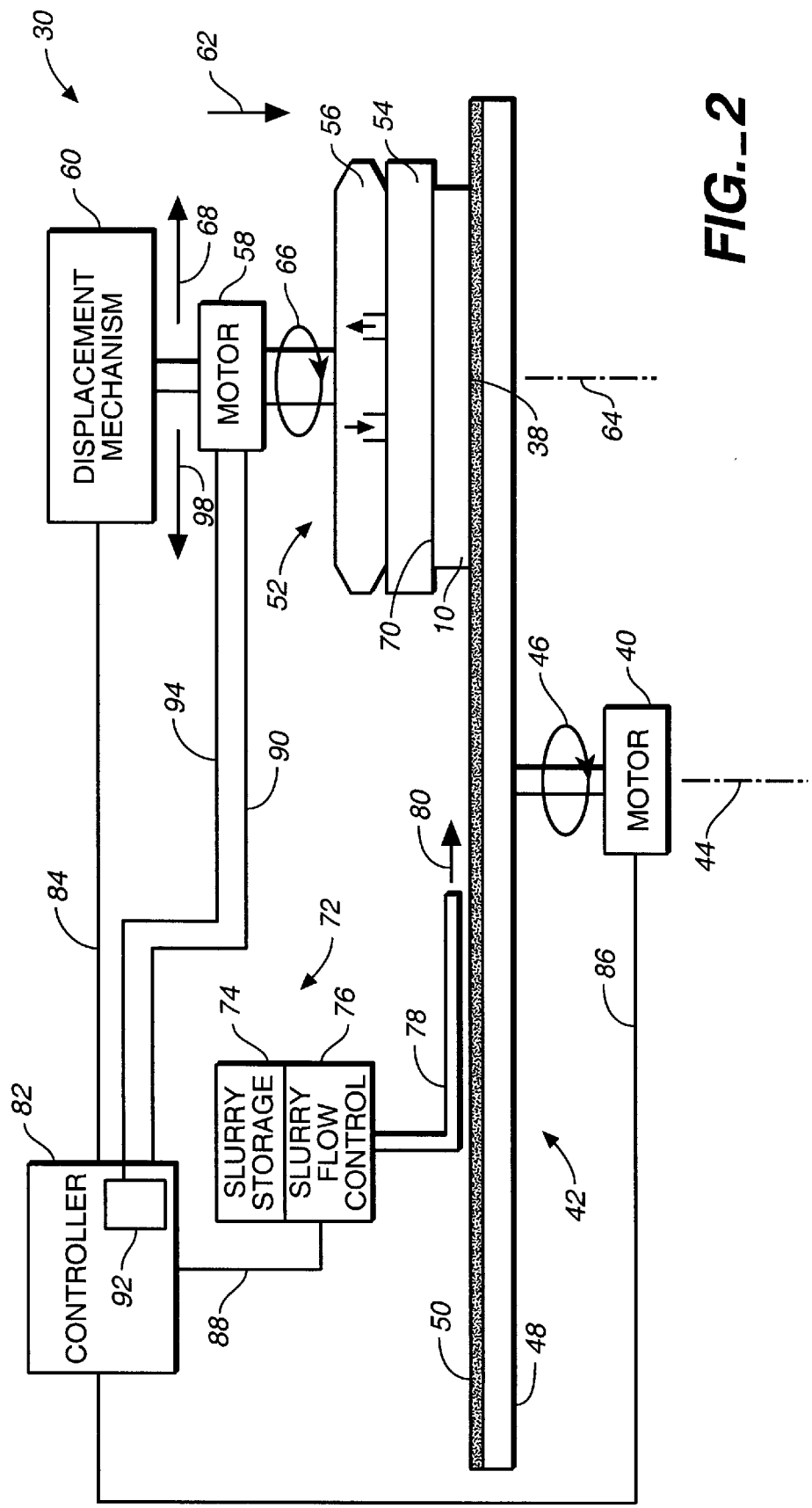
FIG._2

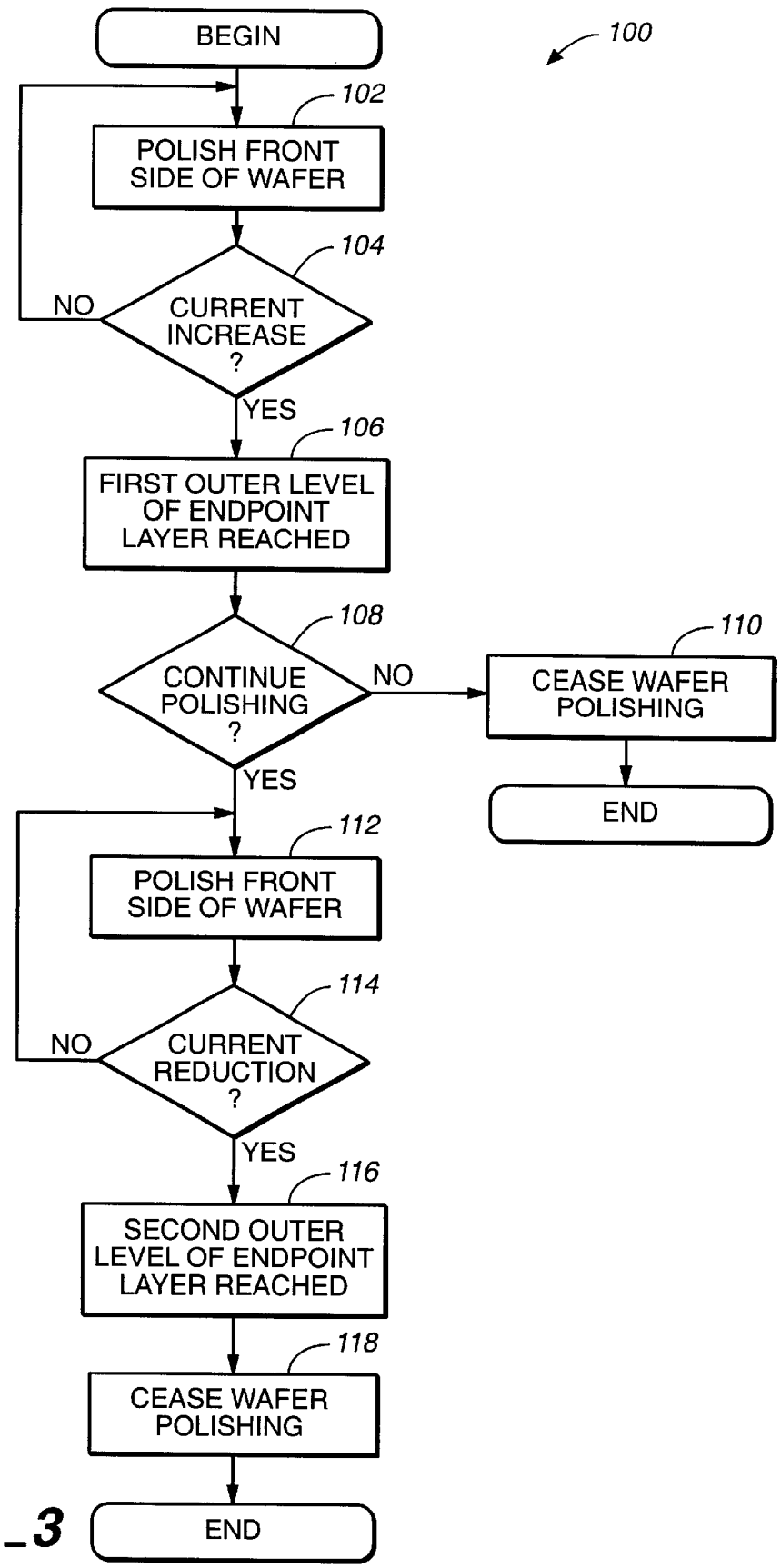
FIG._3

METHOD AND APPARATUS FOR DETECTING AN ION-IMPLANTED POLISHING ENDPOINT LAYER WITHIN A SEMICONDUCTOR WAFER

TECHNICAL FIELD OF THE INVENTION

The present invention relates generally to an endpoint detection method and apparatus, and more particularly to a method and apparatus for detecting an ion-implanted polishing endpoint layer within a semiconductor wafer.

BACKGROUND OF THE INVENTION

Semiconductor integrated circuits are typically fabricated by a layering process in which several layers of material are fabricated on or in a surface of a wafer, or alternatively, on a surface of a previous layer. This fabrication process typically requires subsequent layers to be fabricated upon a smooth, planar surface of a previous layer. However, the surface topography of layers may be uneven due to an uneven topography associated with an underlying layer. As a result, a layer may need to be polished in order to present a smooth, planar surface for a subsequent processing step. For example, a layer may need to be polished prior to formation of a conductor layer or pattern on an outer surface of the layer.

In general, a semiconductor wafer may be polished to remove high topography and surface defects such as crystal lattice damage, scratches, roughness, or embedded particles of dirt or dust. The polishing process typically is accomplished with a polishing system that includes top and bottom platens (e.g. a polishing table and a wafer carrier or holder), between which the semiconductor wafer is positioned. The platens are moved relative to each other thereby causing material to be removed from the surface of the wafer. This polishing process is often referred to as mechanical planarization (MP) and is utilized to improve the quality and reliability of semiconductor devices. The polishing process may also involve the introduction of a chemical slurry to facilitate higher removal rates, along with the selective removal of materials fabricated on the semiconductor wafer. This polishing process is often referred to as chemical mechanical planarization or chemical mechanical polishing (CMP).

In these polishing processes, it is often important to determine an endpoint of the polishing process. Overpolishing (removing too much) of a conductive layer results in increased circuit resistance and potential scrapping of the semiconductor wafer. Since many processing steps have occurred prior to the polishing process, scrapping a semiconductor wafer during fabrication may undesirably result in significant financial loss. Underpolishing (removing too little) of a conductive layer on the other hand leads to failure in isolating circuits and results in electrical shorts. Presence of such electrical shorts leads to rework (redoing the CMP process) thereby disadvantageously increasing costs (e.g. production costs) associated with the semiconductor wafer. Thus, a precise endpoint detection technique is needed.

A typical method employed for determining the endpoint in polishing systems is to measure the amount of time needed to planarize a first wafer, and thereafter polishing the remaining wafers for a similar amount of time. In practice this method is extremely time consuming since machine operators must inspect each wafer after polishing. In particular, it is extremely difficult to precisely control the removal rate of material since the removal rate may vary during the polishing of an individual wafer. Moreover, the removal rate may be diminished in the process of polishing a number of wafers in sequence.

Another method employed for determining endpoint in polishing systems is to form a polishing endpoint layer in the semiconductor device, and thereafter polish the semiconductor device down to the polishing endpoint layer. To this end, polishing systems detect when the polishing process reaches the polishing endpoint layer and terminate the polishing process in response to reaching the polishing endpoint layer. Various techniques have been used to detect when the polishing process reaches the polishing endpoint layer. For example, U.S. Pat. No. 5,668,063 issued to Fry et al polishes a semiconductor device down to a tracer layer of detectable material. The polishing system of Fry determines that the tracer layer has been reached when a chemical element detector detects if materials, such as boron or phosphorous, associated with the tracer layer have been removed by the polishing process. However, such techniques undesirably require relatively complex chemical analysis equipment thereby undesirably increasing costs associated with the semiconductor wafers.

Thus, a continuing need exists for a method and an apparatus which accurately and efficiently detects when a polishing system polishes a semiconductor device down to a desired polishing endpoint layer.

SUMMARY OF THE INVENTION

In accordance with one embodiment of the present invention, there is provided a method of fabricating a semiconductor wafer. The method includes the step of implanting ions into the wafer so as to form a polishing endpoint layer in the wafer. The ion-implanted polishing endpoint layer has a first outer level and a second outer level. The method also includes the step of polishing the wafer in order to remove material from the wafer. The method further includes the step of detecting a first change in friction when material of the ion-implanted polishing endpoint layer begins to be removed during the polishing step so as to determine that the wafer has been polished to the first outer level of the ion-implanted polishing endpoint layer. The method yet further includes the step of detecting a second change in friction when material of the ion-implanted polishing endpoint layer ceases to be removed during the polishing step so as to determine that the wafer has been polished to the second outer level of the ion-implanted polishing endpoint layer. Moreover, the method includes the step of terminating the polishing step in response to detection of the second change in friction.

Pursuant to another embodiment of the present invention, there is provided a method of planarizing a semiconductor wafer down to a predetermined distance from a semiconductor substrate of the wafer. The method includes the step of implanting ions into the wafer so as to form a polishing endpoint layer that is spaced apart from the substrate of the wafer by the predetermined distance. The method also includes the step of rotating the wafer with a wafer motor so as to polish the wafer in order to remove material from the wafer. The method further includes the step of detecting a difference in current drawn by the wafer motor when material of the ion-implanted polishing endpoint layer begins to be removed during the rotating step. Moreover, the method includes the step of terminating the rotating step in response to detecting the difference in current drawn by the wafer motor.

Pursuant to yet another embodiment of the present invention, there is provided an apparatus for polishing a semiconductor wafer down to a polishing endpoint layer which is formed by implanting ions into the wafer. The wafer has a first side and a second side. The apparatus includes a polishing platen having a polishing surface. The apparatus also includes a wafer carrier configured to engage the wafer by the second side of the wafer and press the first side of the wafer against the polishing surface of the polishing platen. The apparatus further includes a wafer motor for rotating both the wafer carrier and the wafer. Moreover, the apparatus includes a polishing endpoint detector that is operable to detect a first difference in current drawn by the wafer motor when material of the ion-implanted polishing endpoint layer begins to be removed during polishing of the wafer, detect a second difference in current drawn by the wafer motor when material of the ion-implanted polishing endpoint layer ceases to be removed during polishing of the wafer, and cause polishing of the wafer to terminate in response to detection of the second difference in current drawn by the wafer motor.

Pursuant to a further embodiment of the present invention, there is provided a method of fabricating a semiconductor wafer having a polishing endpoint layer which is formed by implanting ions into the wafer. The method includes the step of polishing the wafer in order to remove material from the wafer. The method also includes the step of detecting a first change in friction when material of the ion-implanted polishing endpoint layer begins to be removed during the polishing step. The method further includes the step of detecting a second change in friction when material of the ion-implanted polishing endpoint layer ceases to be removed during the polishing step. Moreover, the method includes the step of terminating the polishing step in response to detection of the second change in friction.

It is an object of the present invention to provide an improved method and apparatus for determining an endpoint of a polishing process.

It is an object of the present invention to provide a new and useful method and apparatus for determining an endpoint of a polishing process.

It is a further object of the present invention to provide a method and apparatus for determining that a polishing system has polished a wafer down to a polishing endpoint without removing the wafer from the polishing system.

The above and other objects, features, and advantages of the present invention will become apparent from the following description and the attached drawings.

BRIEF DESCRIPTION OF THE DRAWINGS

FIGS. 1A–1H show sectional views of a semiconductor wafer during various steps of a fabrication process;

FIG. 2 shows an embodiment of a polishing system which incorporates various features of the present invention therein; and FIG. 3 shows a flowchart of a polishing procedure used by the polishing system of FIG. 2.

DETAILED DESCRIPTION OF A PREFERRED EMBODIMENT

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Referring now to FIGS. 1A–1H, there is shown a semiconductor wafer 10 after various steps of a fabrication process of the present invention. In particular, FIGS. 1A and 1B show the semiconductor wafer 10 after a number of fabrication steps. The semiconductor wafer 10 includes a semiconductor substrate 12, such as silicon. A first insulating layer 14 and a first metal layer 16 are deposited or otherwise disposed on the semiconductor substrate 12. In particular, the fabrication process deposits the first insulating layer 14 on the semiconductor substrate 12 such that a contact hole 20 is formed in the first insulating layer 14 at a location above a transistor portion of the semiconductor substrate 12. Moreover, the fabrication process patterns the first metal layer 16 (e.g. aluminum) over the first insulating layer 14 and the contact hole 20. As a result, the first metal layer 16 fills the contact hole 20 forming an electrical contact with the transistor portion of the semiconductor substrate 12. Moreover, the filling of the contact hole 20 forms a pit 22 in the portion of the first metal layer 16 disposed above the contact hole 20.

As shown in FIG. 1C, a second insulating layer 24 is deposited on the outer surface of the first insulating layer 14 and the first metal layer 16. The second insulating layer 24 has an uneven surface topography as a result of the varying topography associated with the first insulating layer 14 and a first metal layer 16. The uneven surface topography of the second insulating layer 24 may cause accuracy problems in fabricating additional layers associated with the semiconductor wafer 10. For example, the uneven surface topography may cause accuracy problems for a lithography process which is utilized to pattern a second metal layer 26 (FIG. 1H) on the second insulating layer 24. As shall be discussed below in more detail, in order to avoid such accuracy problems associated with the uneven topography of the second insulating layer 24, a polishing system, such as a polishing system 30 of FIG. 2, polishes the second insulating layer 24 down to either a first outer level 28 or a second outer level 32 thereby planarizing the surface of the second insulating layer 24.

In order to enable the polishing system 30 of FIG. 2 to accurately determine when the first outer level 28 is reached, a polishing endpoint layer 18 is implanted into the second insulating layer 24. As will be discussed in more detail below, the polishing endpoint layer 18 of the present invention includes an implanted material 96 which the polishing system 30 uses in determining a polishing endpoint. In particular, the fabrication process implants ions into the second insulating layer 24. Such ion implantation causes damage to the glass associated with the insulating layer 24 thereby decreasing the hardness thereof. Selection of a particular type of ion may be varied in order to fit the requirements of a given semiconductor wafer 10. For example, the depth at which the ion is implanted may be varied based upon the type of ion which is implanted. Moreover, the amount of damage to the glass associated with the insulating layer 24 (and therefore the hardness of the resulting polishing endpoint layer 18) may be varied based upon the type of ion which is implanted. Examples of ions which are suitable for use in the present invention include, but are not limited to, a number of singly ionized Boron ions ($^+B^{11}$), a number of singly ionized Arsenic ions ($^+As^{75}$), or a number of singly ionized Boron-Fluorine molecular species ($^+BF_2^{49}$). As shown in FIG. 1D, the ion-implanted polishing endpoint layer 18 starts at the first outer level 28 and ends at the second outer level 32 that lies above the first metal layer 16. Methods of ion implanting into a semiconductor wafer 10 are well known in the art. Accordingly, ion implantation techniques are not described herein.

However, it should be appreciated by those skilled in the art, that implantation techniques distribute the implanted material 96 at various depths from the surface of implantation with a peak distribution occurring at the desired depth. Accordingly, implantation techniques implant some material at a depth greater than the desired depth and implant some material at a depth less than the desired depth. Since implantation of the material 96 into underlying layers may result in reliability problems, the implantation technique should ensure that the underlying layers (such as the first metal layer 16) are not contaminated with the implanted material 96. Furthermore, since the polishing system 30 utilizes the implanted material 96 of the polishing endpoint layer 18 to determine the polishing endpoint, the implantation technique should implant the material 96 of the polishing endpoint layer 18 such that the polishing endpoint layer 18 starts below a level 34 that corresponds to the lowest part of the surface to be planarized.

The implantation technique also tends to create a nonplanar polishing endpoint layer 18 due to the uneven surface topography of the second insulating layer 24. Since the implantation technique implants the material 96 of the polishing endpoint layer through the surface of the second insulating layer 24, the ion-implanted polishing endpoint layer 18 generally follows the topography of the second insulating layer 24. As a result, the implantation technique needs to account for the uneven topography of the second insulating layer 24 when determining the desired depth of the ion-implanted polishing endpoint layer 18. In some cases it may be desirable to polish the surface of the semiconductor wafer 10 prior to implanting the polishing endpoint layer 18 in order to lessen variations in the surface topography of the second insulating layer 24. Polishing the second insulating layer 24 prior to implanting the polishing endpoint layer 18 generally generates a more planar polishing endpoint layer 18 thereby facilitating implantation of the polishing endpoint layer 18 at a depth which is deep enough to allow the polishing system 30 to planarize the semiconductor wafer 10 without causing contamination of the underlying layers (e.g. the first metal layer 16) with implanted material.

FIG. 1E shows the semiconductor wafer 10 after the polishing system 30 has polished the semiconductor wafer 10 down to the first outer level 28 of the ion-implanted polishing endpoint layer 18. As shall be discussed below in more detail, the polishing system 30 may be operated such that the semiconductor wafer 10 is polished down to the first outer level 28 thereby creating a planar surface upon which additional layers may be deposited or otherwise fabricated. It should be appreciated that when the polishing system 30 is operated in such a manner, the polishing endpoint layer 18 is not completely removed from the semiconductor wafer 10 thereby allowing the implanted material 96 to remain in the second insulating layer 24 during subsequent processing of the semiconductor wafer 10.

However, as shown in FIG. 1F, the polishing system 30 is preferably operated such that substantially all of the polishing endpoint layer 18 is removed prior to subsequent processing of the semiconductor wafer 10. In particular, the polishing system 30 may be operated such that the semiconductor wafer 10 is polished down to the second outer level 32 thereby creating a planar surface upon which additional layers may be deposited or otherwise fabricated. It should be appreciated that when the polishing system 30 is operated in such a manner, substantially all of the polishing endpoint layer 18 is removed from the semiconductor wafer 10 thereby removing substantially all of the implanted material 96 from the second insulating layer 24 prior to subsequent processing of the semiconductor wafer 10.

As alluded to above, once the semiconductor wafer 10 has been polished such that a planar surface is created, additional layers may be deposited or otherwise fabricated thereon. For example, as shown in FIGS. 1G and 1H, a via hole 36 may be etched through the second insulating layer 24. Thereafter, the second metal layer 26 may be deposited on the second insulating layer 24. It should be appreciated that numerous additional layers may be deposited on the semiconductor wafer 10 in the manner previously described.

Referring now to FIG. 2, there is shown a preferred embodiment of the polishing system 30 which is used to planarize a front side or surface 38 of the semiconductor wafer 10. The polishing system 30 includes a platen motor or other drive mechanism 40 and a platen assembly 42. The platen motor 40 rotates the platen assembly 42 about a center axis 44. The platen motor 40 may rotate the platen assembly 42 in a clockwise direction (as shown by arrow 46 of FIG. 2) or in the counterclockwise direction.

The platen assembly 42 includes a polishing platen 48 and polishing pad 50 mounted on the polishing platen 48. Both the polishing platen 48 and the polishing pad 50 are preferably circular and collectively define a polishing surface against which the front side 38 of the semiconductor wafer 10 may be polished. Moreover, the polishing pad 50 is typically made of blown polyurethane which protects the polishing platen 48 from chemical slurry and other chemicals introduced during the polishing process.

The polishing system 30 also includes a polishing head assembly 52. The polishing head assembly 52 includes a wafer carrier 54, a cooling mechanism 56, a wafer carrier motor or other drive mechanism 58, and a wafer carrier displacement mechanism 60. The wafer carrier 54 applies a controlled, adjustable force in the general direction of arrow 62 in order to press the front side 38 of the semiconductor wafer 10 into contact with the polishing pad 50 so as to facilitate polishing of the front side 38 of the semiconductor wafer 10.

The wafer carrier motor 58 rotates the wafer carrier 54 and the semiconductor wafer 10 about a center axis 64. The wafer carrier motor 58 may rotate the wafer carrier 54 in a clockwise direction (as shown by arrow 66 of FIG. 2) or in the counterclockwise direction. However, the wafer carrier motor 58 preferably rotates the wafer carrier 54 in the same rotational direction as the platen motor 40 rotates the platen assembly 42 (although the wafer carrier motor 58 may rotate the semiconductor wafer 10 in the rotational direction opposite the rotational direction of the platen assembly 42 as desired).

The wafer carrier 54 also includes mechanisms (not shown) for holding the semiconductor wafer 10. For example, the wafer carrier 54 may include a vacuum-type mechanism which generates a vacuum force that draws the semiconductor wafer 10 against the wafer carrier 54. Once the semiconductor wafer 10 is positioned on the wafer carrier 54 and held in contact with the platen assembly 42 for polishing, the vacuum force may be removed. In such an arrangement, the wafer carrier 54 may be designed with a friction surface or a carrier pad which engages a back side 70 of the semiconductor wafer 10. Such a carrier pad, along with the force being applied in the general direction of arrow 62, creates a frictional force between the wafer carrier 54 and the semiconductor wafer 10 that effectively holds the semiconductor wafer 10 against the wafer carrier 54 thereby causing the semiconductor wafer 10 to rotate at the same velocity as the wafer carrier 54. It should be appreciated that such wafer carriers and carrier pads are of conventional design and are commercially available.

The cooling mechanism 56 counteracts heat generated during the polishing process in order to maintain the wafer carrier 54 at a substantially constant temperature. In particular, the cooling mechanism 56 neutralizes the heat generated due to friction and a chemical slurry reacting with the front side 38 of the semiconductor wafer 10.

The displacement mechanism 60 selectively moves the wafer carrier 54 and hence the semiconductor wafer 10 across the platen assembly 42 in the general direction of arrows 68 and 98. Such movement defines a polishing path which may be linear, sinusoidal, or a variety of other patterns. The wafer carrier displacement mechanism 60 is also capable of moving the semiconductor wafer 10 along a polishing path to a location beyond the edge of the polishing pad 50 so that the semiconductor wafer 10 "overhangs" the edge. Such an overhanging arrangement permits the semiconductor wafer 10 to be moved partially on and partially off the polishing pad 50 to compensate for polishing irregularities caused by a relative velocity differential between the faster moving outer portions and the slower moving inner portions of the platen assembly 42.

The polishing system 30 also includes a chemical slurry system 72. The slurry supply system 72 includes a slurry storage reservoir 74, a slurry flow control mechanism 76, and a slurry conduit 78. The slurry storage reservoir 74 includes one or more containers for storing slurry. In particular, the slurry storage reservoir 74 contains a chemical slurry that includes abrasive material which facilitates polishing of the front side 38 of the semiconductor wafer 10 and reactants which selectively react to certain materials of the front side 38 of the semiconductor wafer 10. Chemical slurries having such properties are well known and commercially available.

The slurry flow control mechanism 76 controls the flow of slurry from the slurry storage 74, through the slurry conduit 78, and onto the polishing area atop the platen assembly 42. Hence, the slurry flow control mechanism 76 and the slurry conduit 78 selectively introduce a flow of slurry (as indicated by arrow 80) atop the polishing pad 50.

The polishing system 30 further includes a controller 82 for controlling the polishing system 30 in order to effectuate the desired polishing results for the semiconductor wafer 10. In particular, the controller 82 is electrically coupled to the displacement mechanism 60 via a signal line 84 to monitor and controllably adjust the polishing path of the semiconductor wafer 10 and the speed at which the semiconductor wafer 10 is moved across the platen assembly 42.

Moreover, the controller 82 is electrically coupled to the platen motor 40 via a signal line 86 in order to monitor the output speed of the platen motor 40 and hence the rotational velocity of the platen assembly 42. The controller 82 adjusts the output speed of the platen motor 40 and hence the rotational velocity of the platen assembly 42 as required by predetermined operating parameters.

The controller 82 is electrically coupled to the slurry flow control mechanism 76 via a signal line 88 in order to monitor the flow rate of the chemical slurry onto the polishing pad 50 of the platen assembly 42. The controller 82 adjusts the flow rate of the chemical slurry onto the polishing pad 50 of the platen assembly 42 as required by predetermined operating parameters.

The controller 82 is electrically coupled to the wafer carrier motor 58 via a signal line 90 in order to monitor the output speed of the wafer carrier motor 58 and hence the rotational velocity of the wafer carrier 54. The controller 82 adjusts the output speed of the wafer carrier motor 58 and hence the rotational velocity of the wafer carrier 54 as required by predetermined operating parameters. Moreover, the controller 82 functions as a polishing endpoint detector by monitoring the amount of current which is being drawn by the wafer carrier motor 58 in order to determine when the semiconductor wafer 10 has been polished to a desired level (i.e. the first outer level 28 or the second outer level 32 of the polishing endpoint layer 18). In particular, the controller 82 includes a current detection or sensing circuit 92 which is electrically coupled to the wafer carrier motor 58 via a signal line 94 in order to sense the amount of current being drawn by the wafer carrier motor 58.

It should be appreciated that the amount of current being drawn by the wafer carrier motor 58 is indicative of the material characteristics of the layer of the semiconductor wafer 10 which is being polished. In particular, the wafer carrier motor 58 draws more current when a relatively soft layer of material is being polished as compared to when a relatively hard layer of material is being polished. This is true since a relatively large amount of material is removed from the soft layer at any given time thereby increasing the amount of friction created between the front side 38 of the semiconductor wafer 10 and the polishing pad 50. It should be appreciated that such an increase in friction increases the mechanical drag on the wafer carrier motor 58. In response to such an increase in mechanical drag, the wafer carrier motor 58 draws more current in order to maintain the rotational velocity of the wafer carrier 54 at a predetermined magnitude.

Conversely, the wafer carrier motor 58 draws less current when a relatively hard layer of material is being polished as compared to when a relatively soft layer of material is being polished. This is true since a relatively small amount of material is removed from the hard layer at any given time thereby decreasing the amount of friction created between the front side 38 of the semiconductor wafer 10 and the polishing pad 50. It should be appreciated that such a decrease in friction decreases the mechanical drag on the wafer carrier motor 58. In response to such a decrease in mechanical drag, the wafer carrier motor 58 draws less current in order to maintain the rotational velocity of the wafer carrier 54 at the predetermined magnitude.

From the above discussion, it should be appreciated that the current sensing circuit 92 senses a change or difference in the amount of current being drawn by the wafer carrier motor 58 where the interface between adjacent layers of the semiconductor wafer 10 is being polished. For example, a current reduction is detected by the current sensing circuit 92 as the polishing system 30 transitions from polishing a relatively soft layer of material associated with the semiconductor wafer 10 (e.g. the polishing endpoint layer 18) to polishing a relatively hard layer of material (e.g. the second insulating layer 24). Conversely, a current increase is detected by the current sensing circuit 92 as the polishing system 30 transitions from polishing a relatively hard layer of material associated with the semiconductor wafer 10 (e.g. the second insulating layer 24) to polishing a relatively soft layer of material (e.g. the polishing endpoint layer 18).

Prior to operating the polishing system 30, a fabrication process implants ions so as to form or otherwise fabricate the polishing endpoint layer 18 in the semiconductor wafer 10. In particular, the fabrication process forms the polishing endpoint layer 18 at a predetermined distance from the front side 38 of the semiconductor wafer 10, the substrate 12, or any other layer of the semiconductor wafer 10. Thereafter, the wafer carrier 54 engages the back side 70 of the semiconductor wafer 10 and presses the front side 38 of the semiconductor wafer 10 against the polishing pad 50. The controller 82 then causes the platen motor 40 to rotate the platen assembly 42 and the wafer carrier motor 58 to rotate the wafer carrier 54. The controller 82 may also begin to control the displacement mechanism 60 so as to move the wafer carrier 54 along a predetermined polishing path. The slurry flow control mechanism 76 is also controlled by the controller 82 in order to apply chemical slurry to the polishing pad 50 at a predetermined flow rate. The resulting complex movement of the wafer carrier 54 relative to the polishing pad 50, the force being applied to the semiconductor wafer 10 in the general direction of arrow 62 of FIG. 2, and the chemical slurry all cooperate to selectively remove material from the front side 38 of the semiconductor wafer 10.

In operation, a polishing procedure 100 is executed in order to polish the semiconductor wafer 10 according to the present invention. A flowchart which sets forth the polishing procedure 100 in detail is shown in FIG. 3. Note that prior to polishing the semiconductor wafer 10 via the polishing procedure 100, ion are implanted into the semiconductor wafer 10 in order to create the polishing endpoint layer 18 (see FIG. 1D). Hence, prior to being polished with the polishing system 30, ions are implanted in the semiconductor wafer 10.

The polishing procedure 100 begins with step 102 in which the controller 82 causes the polishing system 30 to begin polishing the front side 38 of the semiconductor wafer 10 in order to remove material therefrom. In particular, the controller 82 actuates the platen motor 40 in order to cause the platen assembly 42 to be rotated. Thereafter, the controller 82 actuates the wafer carrier motor 58 thereby causing the wafer carrier 54 and hence the wafer 10 to be rotated so as to rub the front side 38 of the semiconductor wafer 10 against the rotating platen assembly 42. The controller 82 also actuates the displacement mechanism 60 in order to cause the displacement mechanism 60 to selectively move the wafer carrier 54 and hence the wafer 10 along a predetermined polishing path. Moreover, the controller 82 causes the chemical slurry supply system 72 to apply chemical slurry to the polishing pad 50 of the platen assembly 42 in order to facilitate the removal of material from the front side 38 of the semiconductor wafer 10. The procedure 100 then advances to step 104.

In step 104, the controller 82 determines if there is a change in the amount of current being drawn by the wafer carrier motor 58. In particular, the current sensing circuit 92 associated with the controller 82 monitors the signal line 94 in order to determine if there is an increase in the amount of current being drawn by the wafer carrier motor 58. It should be appreciated that such a change in current being drawn by the wafer carrier motor 58 is indicative of a change in the hardness of the wafer material being removed by the polishing system 30. In particular, as discussed above, an increase in the amount of current being drawn by the wafer carrier motor 58 is indicative of a transition from polishing a relatively hard material to polishing a relatively soft material. Hence, if the controller 82 determines that there is an increase in the amount of current being drawn by the wafer carrier motor 58, the procedure 100 advances to step 106. If the controller 82 determines that the amount of current being drawn by the wafer carrier motor 58 is unchanged, the procedure 100 loops back to step 102 in order to continue polishing the semiconductor wafer 10.

In step 106, the controller 82 concludes that the semiconductor wafer 10 has been polished to the outer surface 28 of the ion-implanted polishing endpoint layer 82. In particular, the controller 82 concludes that the increase in current drawn by the wafer carrier motor 58 (as detected in step 104) is indicative of removal of the relatively soft material associated with the ion-implanted polishing endpoint layer 82. The procedure 100 then advances to step 108.

In step 108, the controller 82 determines if the semiconductor wafer 10 is to be polished down to the outer level 32 of the ion-implanted polishing endpoint layer 18 (thereby removing substantially all of the polishing endpoint layer 18 and the implanted material 96 therein). In particular, as discussed above, the polishing system 30 may be operated to polish the semiconductor wafer 10 down the first outer level 28 of the polishing endpoint layer 18, or may alternatively be operated to polish the semiconductor wafer 10 down the second outer level 32 of the polishing endpoint layer 18. It should be appreciated that when the semiconductor wafer 10 is polished down only to the first outer level 28, substantially all of the polishing endpoint layer 18 (including the implanted material 96 therein) remains in the semiconductor wafer 10 (see FIG. 1E), whereas when the semiconductor wafer 10 is polished down to the second outer level 32, substantially all of the polishing endpoint layer 18 (including the implanted material 96 therein) is removed from the semiconductor wafer 10 (see FIG. 1F). Such a determination as to which level (i.e. the outer level 28 or the outer level 32) the semiconductor wafer 32 is to be polished is preprogrammed based upon the requirements of a given semiconductor wafer design. Hence, if the controller 82 determines that the semiconductor wafer 10 is to be polished only to the first outer level 28 of the polishing endpoint layer 18 (see FIG. 1E), the procedure 100 advances to step 110. If the controller 82 determines that the semiconductor wafer 10 is to be polished to the second outer level 32 of the polishing endpoint layer 18 (see FIG. 1F), the procedure 100 advances to step 112.

In step 110, the controller 82 ceases polishing of the semiconductor wafer 10. In particular, the controller 82 communicates with the platen motor 40, the wafer carrier motor 58, the displacement mechanism 60, and the slurry flow control 76 in order to cease polishing of the semiconductor wafer 10. However, it should be appreciated that the controller 82 may allow the polishing system 30 to continue polishing the semiconductor wafer 10 for a short, predetermined amount of time in order to further remove material from the semiconductor wafer 10. This further removal of material or overpolishing may be desirable after certain steps of a fabrication process. The procedure 100 then ends thereby placing the polishing system 30 in an idle state until actuated to polish a subsequent semiconductor wafer.

Returning now to step 108, if the controller 82 determines that the semiconductor wafer 10 is to be polished to the second outer level 32 of the polishing endpoint layer 18 (see FIG. 1F), the procedure 100 advances to step 112. Instep 112, the controller 82 communicates with the platen motor 40, the wafer carrier motor 58, the displacement mechanism 60, and the slurry flow control 76 in order to continue polishing of the semiconductor wafer 10 in the manner previously discussed. The procedure 100 then advances to step 114.

In step 114, the controller 82 determines if there is a change in the amount of current being drawn by the wafer carrier motor 58. In particular, the current sensing circuit 92 associated with the controller 82 monitors the signal line 94 in order to determine if there is a reduction in the amount of current being drawn by the wafer carrier motor 58. It should be appreciated that such a change in current being drawn by the wafer carrier motor 58 is indicative of a change in the hardness of the wafer material being removed by the polishing system 30. In particular, as discussed above, a reduction in the amount of current being drawn by the wafer carrier motor 58 is indicative of a transition from polishing a relatively soft material to polishing a relatively hard material. Hence, if the controller 82 determines that there is a reduction in the amount of current being drawn by the wafer carrier motor 58, the procedure 100 advances to step 116. If the controller 82 determines that the amount of current being drawn by the wafer carrier motor 58 is unchanged, the procedure 100 loops back to step 112 in order to continue polishing the semiconductor wafer 10.

In step 116, the controller 82 concludes that the semiconductor wafer 10 has been polished to the second outer surface 32 of the polishing endpoint layer 18. In particular, the controller 82 concludes that the reduction in current drawn by the wafer carrier motor 58 (as detected in step 114) is indicative that the polishing system 30 has removed substantially all of the relatively soft material associated with the ion-implanted polishing endpoint layer 18. The procedure 100 then advances to step 118.

In step 118, the controller 82 ceases polishing of the semiconductor wafer 10. In particular, the controller 82 communicates with the platen motor 40, the wafer carrier motor 58, the displacement mechanism 60, and the slurry flow control 76 in order to cease polishing of the semiconductor wafer 10. However, it should be appreciated that the controller 82 may allow the polishing system 30 to continue polishing the semiconductor wafer 10 for a short, predetermined amount of time in order to further remove material from the semiconductor wafer 10. This further removal of material or overpolishing may be desirable after certain steps of a fabrication process. The procedure 100 then ends thereby placing the polishing system 30 in an idle state until actuated to polish a subsequent semiconductor wafer.

While the invention has been illustrated and described in detail in the drawings and foregoing description, such illustration and description is to be considered as exemplary and not restrictive in character, it being understood that only a preferred embodiment has been shown and described and that all changes and modifications that come within the spirit of the invention are desired to be protected.

For example, although ion implantation as described herein produces an polishing endpoint layer 18 which is relatively soft as compared to the remainder of the insulating layer 24, and has significant advantages thereby in the present invention, certain of such advantages may be achieved by implantation of other types of ions. For example, nitrogen ions may be implanted into the semiconductor wafer 10 and thereafter the wafer 10 may be heated to a predetermined temperature in order to produce a polishing endpoint layer which is substantially harder than the remainder of the insulating layer 24. It should be appreciated that in such a configuration, current drawn by the wafer carrier motor 58 would be reduced when the polishing system 30 polishes the semiconductor wafer 10 down to the first outer level 28 of the polishing endpoint layer 18, and would thereafter be increased when the polishing system 30 polishes the wafer 10 down to the second outer level 32 of the polishing endpoint layer 18.

What is claimed is:

1. A method of fabricating a semiconductor wafer, comprising the steps of:

implanting ions into said wafer so as to form a polishing endpoint layer in said wafer, said ion-implanted polishing endpoint layer having a first outer level and a second outer level;

polishing said wafer in order to remove material from said wafer;

detecting a first change in friction when material of said ion-implanted polishing endpoint layer begins to be removed during said polishing step so as to determine that said wafer has been polished to said first outer level of said ion-implanted polishing endpoint layer;

detecting a second change in friction when material of said ion-implanted polishing endpoint layer ceases to be removed during said polishing step so as to determine that said wafer has been polished to said second outer level of said ion-implanted polishing endpoint layer; and terminating said polishing step in response to detection of said second change in friction.

2. The method of claim 1, wherein said implanting step includes the step of implanting ions into said wafer such that said ion-implanted polishing endpoint layer is formed at a predetermined distance from a substrate of said wafer.

3. The method of claim 1, wherein:

said implanting step includes the step of implanting ions through a first side of said wafer so as to form said ion-implanted polishing layer at a predetermined distance from said first side of said wafer, and said polishing step includes the step of polishing said first side of said wafer to remove material therefrom.

4. The method of claim 1, wherein:

said polishing step includes the step of rotating said wafer with a wafer motor, said first change detecting step includes the step of detecting a first difference in current drawn by said wafer motor which corresponds to said wafer having been polished to said first outer level of said ion-implanted polishing endpoint layer, and said second change detecting step includes the step of detecting a second difference in current drawn by said wafer motor which corresponds to said wafer having been polished to said second outer level of said ion-implanted polishing endpoint layer.

5. The method of claim 4, wherein:

said step of detecting said first difference in current drawn by said wafer motor includes the step of detecting an increase in current drawn by said wafer motor, and said step of detecting said second difference in current drawn by said wafer motor includes the step of detecting a reduction in current drawn by said wafer motor.

6. The method of claim 1, wherein all of said ion-implanted polishing endpoint layer is substantially removed from said wafer when said wafer has been polished to said second outer level of said ion-implanted polishing endpoint layer.

7. The method of claim 1, wherein said terminating step includes the step of terminating said polishing step in response to detection of both said first change in friction and said second change in friction.

8. A method of fabricating a semiconductor wafer having a polishing endpoint layer which is formed by implanting ions into said wafer, comprising the steps of:

polishing said wafer in order to remove material from said wafer;

detecting a first change in friction when material of said ion-implanted polishing endpoint layer begins to be removed during said polishing step;

detecting a second change in friction when material of said ion-implanted polishing endpoint layer ceases to be removed during said polishing step; and terminating said polishing step in response to detection of said second change in friction.

9. The method of claim 8, wherein said ion-implanted polishing endpoint layer is formed at a predetermined distance from a substrate of said wafer.

10. The method of claim 8, wherein said terminating step includes the step of terminating said polishing step in response to detection of both said first change in friction and said second change in friction.

11. The method of claim 8, wherein:

said ion-implanted polishing endpoint layer is formed by implanting ions through a first side of said wafer at a predetermined distance from said first side of said wafer, and said polishing step includes the step of polishing said first side of said wafer to remove material therefrom.

12. The method of claim 8, wherein:

said ion-implanted polishing endpoint layer has a first outer level and a second outer level, said first change in friction detecting step includes the step of detecting said first change in friction when material of said ion-implanted polishing endpoint layer begins to be removed during said polishing step so as to determine that said wafer has been polished to said first outer level of said ion-implanted polishing endpoint layer, and said second change in friction detecting step includes the step of detecting said second change in friction when material of said ion-implanted polishing endpoint layer ceases to be removed during said polishing step so as to determine that said wafer has been polished to said second outer level of said ion-implanted polishing endpoint layer.

13. The method of claim 12, wherein:

said polishing step includes the step of rotating said wafer with a wafer motor, said first change detecting step includes the step of detecting a first difference in current drawn by said wafer motor which corresponds to said wafer having been polished to said first outer level of said ion-implanted polishing endpoint layer; and said second change detecting step includes the step of detecting a second difference in current drawn by said wafer motor which corresponds to said wafer having been polished to said second outer level of said ion-implanted polishing endpoint layer.

14. The method of claims 13, wherein:

said step of detecting said first difference in current drawn by said wafer motor includes the step of detecting an increase in current drawn by said wafer motor, and said step of detecting said second difference in current drawn by said wafer motor includes the step of detecting a reduction in current drawn by said wafer motor.

15. The method of claim 12, wherein all of said ion-implanted polishing endpoint layer is substantially removed from said wafer when said wafer has been polished to said second outer level of said ion-implanted polishing endpoint layer.

* * * * *